United States Patent [19]
Sizensky

[11] Patent Number: 4,617,251
[45] Date of Patent: Oct. 14, 1986

[54] STRIPPING COMPOSITION AND METHOD OF USING THE SAME

[75] Inventor: Joseph J. Sizensky, Seekonk, Mass.

[73] Assignee: Olin Hunt Specialty Products, Inc., Palisades Park, N.J.

[21] Appl. No.: 721,965

[22] Filed: Apr. 11, 1985

[51] Int. Cl.$^4$ .......... C11D 7/32; C11D 7/52; C23D 17/00; G03C 17/00
[52] U.S. Cl. .................. 430/256; 134/38; 252/153; 252/162; 252/170; 252/542; 252/544; 252/548; 252/549; 430/258; 430/331
[58] Field of Search .......... 252/548, 542, 153, 158, 252/549, DIG. 8, 162, 170, 544; 134/38; 430/329, 331, 256, 258; 156/659.1

[56] References Cited

U.S. PATENT DOCUMENTS

| 1,829,583 | 10/1931 | Davidson | 252/153 |
|---|---|---|---|
| 2,929,789 | 3/1960 | Pickett | 252/153 |
| 3,417,025 | 12/1968 | Cooper | 252/548 |
| 3,582,401 | 6/1971 | Berilla | 134/3 |
| 3,663,447 | 5/1972 | Murphy | 252/156 |
| 3,663,476 | 5/1972 | Murphy | 252/529 |
| 3,671,465 | 6/1972 | Murphy | 252/548 |
| 3,673,099 | 6/1972 | Corby | 252/156 |
| 3,806,460 | 4/1974 | Mukai | 252/111 |
| 3,813,309 | 5/1974 | Bakos | 156/2 |
| 3,813,343 | 5/1974 | Mukai | 252/111 |
| 3,839,234 | 10/1974 | Roscoe | 252/544 |
| 3,871,929 | 3/1975 | Schevey | 252/79.1 |
| 3,886,099 | 5/1975 | Hall | 252/548 |
| 3,972,839 | 8/1976 | Murphy | 252/548 |
| 4,077,896 | 3/1978 | Bunegar | 252/90 |
| 4,078,102 | 3/1978 | Bendz | 134/38 |
| 4,085,059 | 4/1978 | Smith | 252/118 |
| 4,242,218 | 12/1980 | My | 252/143 |
| 4,276,186 | 6/1981 | Bakos | 252/158 |
| 4,304,681 | 12/1981 | Martin | 252/143 |
| 4,395,348 | 7/1983 | Lee | 252/143 |
| 4,395,479 | 7/1983 | Ward | 430/258 |
| 4,401,747 | 8/1983 | Ward | 430/258 |
| 4,401,748 | 8/1983 | Ward | 430/258 |
| 4,403,029 | 9/1983 | Ward | 430/258 |
| 4,411,983 | 10/1983 | Wasimawa | 430/325 |
| 4,428,871 | 1/1984 | Ward | 252/542 |

FOREIGN PATENT DOCUMENTS 58-80638  5/1983  Japan .

Primary Examiner—Dennis L. Albrecht
Attorney, Agent, or Firm—William A. Simons; Thomas P. O'Day

[57] ABSTRACT

Disclosed is a stripping composition for effectively removing an organic polymeric material from a substrate. The stripping composition is essentially free of phenol compounds and halogenated hydrocarbon compounds and contains a select amine compound and an organic polar solvent. It has been found that the stripping composition is highly effective, even when the organic polymeric material to be removed from a substrate is a positive resist which has been subjected to high temperature post-baking operations.

11 Claims, No Drawings

STRIPPING COMPOSITION AND METHOD OF USING THE SAME

This invention relates to a stripping composition for removing organic polymeric materials from substrates. More particularly, it relates to a stripping composition, essentially free of phenol compounds and halogenated hydrocarbon compounds, and which is highly effective in removing a wide variety of organic polymeric materials from substrates.

Various organic polymeric materials are commonly coated onto substrates during the fabrication of semiconductors and electronic circuits. It later becomes necessary to remove these materials from the substrate, and numerous stripping compositions have been developed for this purpose.

For example, in photolithographic processes, an organic polymeric material, referred to generally as a resist, is deposited as a film onto a substrate, and a desired pattern is defined by exposure of the resist to activating radiation and subsequent development. The pattern defined in the resist is subsequently transferred, via techniques such as etching, to the underlying substrate. Thereafter, it is necessary to evenly and completely remove the resist from the substrate to permit further photolithographic processing steps Stripping compositions containing phenol compounds and/or halogenated hydrocarbon compounds have been widely used in removing resists from substrates. For illustrative purposes, reference can be made to U.S. Pat. Nos. 3,582,401; 3,813,309; and 3,871,929. Stripping compositions of this type present numerous safety and environmental problems, however, due to their toxicity during handling and difficulty of disposal.

In an effort to overcome these drawbacks, a variety of phenol-free and halogenated hydrocarbon-free stripping compositions have been recently developed. For example, stripping compositions based on organic sulfonic acids are disclosed in U.S. Pat. Nos. 4,242,218 and 4,304,681. Stripping compositions containing organic sulfonic acids have not proven to be entirely satisfactory, however, as they are not readily rinsed from the substrate after completion of the stripping operation by the use of aqueous materials, such as deionized water.

Now it has been discovered, in accordance with the present invention, that the foregoing problems can be overcome with a stripping composition that includes a select amine compound and an organic polar solvent, the composition being essentially free of phenol compounds and halogenated hydrocarbon compounds. In the practice of the invention, an organic polymeric material is removed from a substrate by contacting the organic polymeric material with the stripping composition as described above. Surprisingly, it has been found that the stripping composition is highly effective in removing organic polymeric materials from substrates, although as noted it is essentially free of phenol compounds and halogenated hydrocarbon compounds, the use of which is taught in the art. Furthermore, because the stripping composition is essentially free of such deleterious substances, it requires no special handling and is readily disposed of in conventional disposal facilities; as such, the composition is highly desirable from an environmental standpoint.

Other advantages will be apparent from the description which follows, although it should also be noted that the stripping composition, unlike stripping compositions based on organic sulfonic acids, is substantially water rinsable and does not require the use of additional organic solvents. In addition, the stripping composition of the invention does not evidence a staining of the substrate or otherwise attack the substrate during processing.

It has also been surprisingly found, in accordance with the invention, that the stripping composition is particularly effective in removing from substrates positive resists which have been subjected to severe post-baking conditions. Typically, this involves post-baking the positive resist material at a temperature in excess of about 150° C. While many prior art strippers may perform adequately in the removal of resists under normal conditions, they are not sufficiently effective when utilized in an attempt to completely strip high temperature post-baked positive resists.

The stripping composition employed according to the present invention is prepared by mixing a select amine composition and an organic polar solvent. In forming the mixture, usually from about 2 to about 98 percent by weight of the amine compound and from about 98 to about 2 percent by weight of the organic polar solvent are employed. Preferably, the mixture includes from about 10 to about 90 percent by weight of the amine compound and from about 90 to about 10 percent by weight of the organic polar solvent. It is most preferred that the mixture include from about 30 to about 70 percent by weight of the amine compound and from about 70 to about 30 percent by weight of the organic polar solvent.

The amine compound which is used to form the stripping composition of the invention includes the following compounds and mixtures of such compounds: (a) compounds having the formula (I)

wherein $R_1$, $R_2$ and $R_3$ are each independently H, $C_1$-$C_4$OH or $C_1$-$C_4$ alkyl, with the proviso that $R_1$, $R_2$ and $R_3$ cannot simultaneously be H; and (b) compounds having the formula (II)

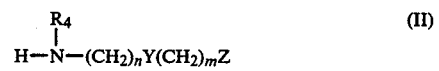

wherein $R_4$ is H, $C_1$-$C_4$OH or $C_1$-$C_4$ alkyl, n and m are each independently an integer ranging from 1-5, inclusive, Y is O, S.

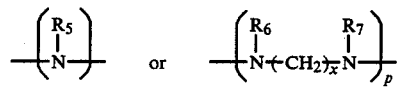

wherein $R_5$ is H, $C_1$-$C_4$OH or $C_1$-$C_4$ alkyl, $R_6$ and $R_7$ are each independently H, $C_1$-$C_4$OH or $C_1$-$C_4$ alkyl and x and p are each independently an integer ranging from 1-5, inclusive, and Z is H, OH or $NR_8R_9$ wherein $R_8$ and $R_9$ are each independently H, $C_1$-$C_4$OH or $C_1$-$C_4$ alkyl.

Preferably, the amine compound includes the following compounds and mixtures of such compounds: (a) compounds having the formula (I) wherein $R_1$ and $R_2$ are each H and $R_3$ is $C_1$-$C_4$OH; and (b) compounds having the formula (II) wherein $R_4$ is H and n, m, Y and Z are as defined above.

Particularly preferred amine compounds include the following compounds and mixtures of such compounds: compounds having the formula (II) wherein $R_4$ is H, n and m are each independently an integer ranging from 1-3, inclusive, Y is O or NH and Z is H, OH or $NH_2$.

In the most preferred embodiments of the invention, the amine compound is 2-(2-aminoethoxy) ethanol, 2-(2-aminoethylamino) ethanol or a mixture of such compounds.

In forming the stripping composition of the invention, any suitable organic polar solvent, which is essentially free of phenol compounds and halogenated hydrocarbon compounds may be employed. Preferably, the organic polar solvent is miscible with water and with the amine compound and does not react with the amine compound. It is also desirable that the organic polar solvent not damage or degrade the substrate from which the organic polymeric material is to be removed.

It is also preferable that the organic polar solvent have a boiling point greater than about 140° C. Otherwise, a substantial amount of the organic polar solvent could evaporate during the step of contacting the organic polymeric material with the stripping composition, depending upon the conditions at which the step is carried out, leading to a diminution of the effectiveness of the removal operation.

Preferred organic polar solvents include those containing a carbon-oxygen bond or a sulfur-oxygen bond. Illustrative organic polar solvents which can be utilized according to the invention include the following and mixtures thereof: N,N-dialkylalkanoylamides, such as N,N-dimethylacetamide and dimethylformamide; N-alkyl lactams, such as N-methyl-2-pyrrolidinone; cyclic aliphatic sulfones, such as sulfolane; sulfoxides, such as dimethyl sulfoxide; acetate esters of ethylene/propylene glycol ethers, such as carbitol acetate and methoxyacetoxypropane; ether alcohols such as tetrahydrofurfuryl alcohol; cyclic ketones, such as isophorone; lactones, such as γ-butyrolactone; and esters of dibasic acids, such as dimethyl adipate and dimethyl glutarate.

Various other ingredients known to those skilled in the art may optionally be included in the stripping composition, e.g. dyes or colorants, wetting agents, surfactants, antifoamers and so forth. A substantial amount of water, up to about 50 percent by weight or more, may also be included without significantly detracting from the effectiveness of the stripping composition.

The described stripping composition is used in removing an organic polymeric material from a substrate. The method of the invention is carried out by contacting an organic polymeric material with the described stripping composition. The actual conditions, i.e., temperature, time, etc., may vary over wide ranges and are generally dependent on the nature and thickness of the organic polymeric material to be removed, as well as other factors familiar to those skilled in the art. In general, however, temperatures ranging from about 15° C. to about 100° C. for a period of about 10 seconds to about 0.5 hours are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripping composition of the invention is effective in removing a wide variety of organic polymeric materials from substrates. Exemplificative organic polymeric materials include positive and negative resists, electron beam resists, x-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethylmethacrylate-containing resists which are useful as electron beam or deep UV resists. In particularly preferred embodiments of the invention, the stripping composition has been found to be highly effective in removing positive resists containing a novolak resin and a diazo ketone sensitizer, e.g. ortho naphthoquinone diazide sulfonic acid ester; resists of this type include WAYCOAT HPR 204 POSITIVE RESIST, WAYCOAT HPR 206 POSITIVE RESIST and WAYCOAT HPR 1182 POSITIVE RESIST, all available commercially from Philip A. Hunt Chemical Corporation. The organic polymeric material can be removed from any of the conventional substrates known to those skilled in the art, such as silicon, silicon dioxide, silicon nitride, polysilicon, aluminum, aluminum alloys, copper, copper alloys, polyimides, and so forth.

The following examples are provided to illustrate the invention. Unless otherwise specified, all parts and percentages in the examples are by weight.

EXAMPLES 1-20

Silicon dioxide coated silicon wafers were coated with a positive resist[1] by spin coating at 5000 rpm for 30 seconds to provide a film thickness of about 1 micron. The resist-coated wafers were pre-baked at 100°-105° C. for 30 minutes in a convection oven, and then post-baked at about 200° C. for 30 minutes in a convection oven. Stripping baths containing stripping compositions of the invention were maintained at a constant temperature of 95° C. with constant stirring and the post-baked resist-coated wafers were immersed in the baths for about 5 minutes. The wafers were then removed from the baths, rinsed with deionized water and dried in a conventional manner.

[1] A positive resist containing a novolak resin and an ortho naphthoquinone diazide sulfonic acid ester sensitizer, commercially available from Philip A. Hunt Chemical Corporation under the designation "WAYCOAT HPR 204 POSITIVE RESIST".

The stripping compositions employed and the results obtained for each are summarized in Table I below. In each case, with the exception of Example 16, either all or virtually all of the resist was removed with the stripping composition utilized. In Example 16, there was a 50% removal; however, when this Example was repeated by employing an immersion time of about 10-15 minutes, 100% removal was achieved.

In Table I, the following abbreviations are used:

| For The Amine Compounds | |
|---|---|
| AEE | 2-(2-Aminoethoxy) Ethanol |
| IBPA | 3,3'-Iminobispropylamine |
| TEA | Triethanolamine |
| MEA | Monoethanolamine |
| DEA | Diethanolamine |
| AEAE | 2-(2-Aminoethylamino) Ethanol |

| | -continued | |
|---|---|---|
| TT | Triethylenetetramine | |
| APDEA | N—(3-Aminopropyl) Diethanolamine | |
| For the Organic Polar Solvents | | |
| NMP | N—Methyl-2-Pyrrolidinone | |
| CA | Carbitol Acetate | |
| THFA | Tetrahydrofurfuryl Alcohol | |
| I | Isophorone | |
| DMSO | Dimethyl Sulfoxide | |
| DBE-3 | Dibasic Ester, a mixture of 90% Dimethyl Adipate and 10% Dimethyl Glutarate | |
| S | Sulfolane (Tetramethylenesulfone) | |
| BL | γ-Butyrolactone | |
| PMA | Methoxyacetoxypropane | |
| DMAC | N,N—Dimethylacetamide | |

TABLE I

| Example No. | Stripping Composition Amine Compound | Organic Polar Solvent | Weight Percent of Ingredients Amine Compound/Organic Polar Solvent | Percent of Resist Stripped |
|---|---|---|---|---|
| 1 | AEE | NMP | 50/50 | 100 |
| 2 | AEE | CA | 50/50 | 100 |
| 3 | AEE | THFA | 50/50 | 100 |
| 4 | AEE | I | 50/50 | 100 |
| 5 | AEE | DMSO | 50/50 | 100 |
| 6 | AEE | DBE-3 | 50/50 | 100 |
| 7 | AEE | S | 50/50 | 100 |
| 8 | AEE | BL | 20/80 | 90 |
| 9 | IBPA | S | 50/50 | 100 |
| 10 | IBPA | PMA | 50/50 | 100 |
| 11 | TEA | NMP | 50/50 | 99 |
| 12 | MEA | CA | 50/50 | 100 |
| 13 | AEE | S | 10/90 | 90–95 |
| 14 | AEE | S | 25/75 | 100 |
| 15 | AEE | S | 90/10 | 100 |
| 16 | AEE | S | 5/95 | 50[1] |
| 17 | DEA | DMAC | 60/40 | 100 |
| 18 | AEAE | THFA | 25/75 | 100 |
| 19 | TT | S | 40/60 | 100 |
| 20 | APDEA | I | 80/20 | 90–95 |

[1] 100% Removal if immersed for about 10–15 minutes

EXAMPLE 21

Silicon dioxide coated silicon wafers were coated with a positive resist[1] by spin coating at 5000 rpm for 30 seconds to provide a film thickness of about 1 micron. The resist-coated wafers were pre-baked at 100°–105° C. for 30 minutes in a convection oven. The pre-baked resist-coated wafers were then exposed through a Focus Wedge mask on a Perkin Elmer Micralign 111 (1.0 mm slit width, aperture #1). The exposed wafers were developed for about 60 seconds by immersion in an aqueous developing solution containing tetramethylammonium hydroxide. The developed wafers were post-baked at about 135° C. for 30 minutes in a convection oven. A stripping bath containing a stripping composition of the invention was maintained at room temperature with constant stirring. The stripping composition contained a 50/50 weight percent mixture of 2-(2-aminoethoxy) ethanol and N-methyl-2-pyrrolidinone. The post-baked resist-coated wafers were immersed in the bath for about 5 minutes, after which the wafers were removed from the bath, rinsed with deionized water and dried in a conventional manner.

[1] A positive resist containing a novolak resin and an ortho naphthoquinone diazide sulfonic acid ester sensitizer, commercially available from Philip A. Hunt Chemical Corporation under the designation "WAY-COAT HPR 204 POSITIVE RESIST".

The results showed that 100% of the resist was removed from the silicon dioxide substrates.

EXAMPLE 22

Example 21 was repeated, except that the developed wafers were post-baked at about 165° C. and the stripping bath was maintained at a temperature of 95° C.

The results showed that 100% of the resist was removed from the silicon dioxide substrates.

What is claimed is:

1. A method for removing a positive resist from a substrate, wherein said positive resist contains a novolak resin and a diazo ketone sensitizer and has been post-baked at a temperature of at least about 150°, comprising contacting said positive resist with a non-aqueous stripping composition which is essentially free of phenol compounds and halogenated hydrocarbon compounds and consisting essentially of:

(a) from about 2 percent to about 98 percent by weight of an amine compound selected from the group consisting of compounds having the formula:

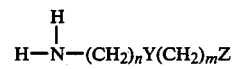

wherein n and m are each independently an integer ranging from 1-5, inclusive; Y is either —O— or —(NH)—; and Z is —H, —OH or —NH$_2$; and mixtures thereof; and (b) from about 98 to about 2 percent by weight of an organic polar solvent selected from the group consisting of N-methyl-2-pyrrolidinone, tetrahydrofurfuryl alcohol, isophorone, dimethyl sulfoxide, dimethyl adipate, dimethyl glutarate, sulfolane, γ-butyrolactone, N,N,-dimethylacetamide and mixtures thereof.

2. The method of claim 1 wherein said stripping composition consists essentially of about 10 percent to about 90 percent by weight of said amine compound and from about 90 percent to about 10 percent by weight of said organic polar solvent.

3. The method of claim 2 wherein said stripping composition consists essentially of about 30 percent to about 70 percent by weight of said amine compound and from about 70 percent to about 30 percent by weight of said organic polar solvent.

4. The method of claim 1 wherein said amine compound is 2-(2-aminoethoxy)-ethanol.

5. The method of claim 1 wherein said amine compound is 2-(2-aminoethylamino)-ethanol.

6. The method of claim 1 wherein said organic polar solvent is N-methyl-2-pyrrolidinone.

7. The method of claim 6 wherein said amine compound is 2-(2-aminoethoxy)-ethanol,2-(2-aminoethylamino)-ethanol and mixtures thereof.

8. The method of claim 7 wherein said stripping composiiton consists essentially of about 10 percent to about 90 percent by weight of said amine compound and from about 90 percent to about 10 percent by weight of said organic polar solvent.

9. The method of claim 8 wherein said stripping composition consists essentially of about 30 percent to about 70 percent by weight of said amine compound and from about 70 percent to about 30 percent by weight of said organic polar solvent.

10. The method of claim 1 wherein said substrate is selected from the group consisting of silicon, silicon dioxide, silicon nitride, polysilicon, aluminum, aluminum alloys, cooper, copper alloys, and polyimides.

11. The method for removing a positive resist from a substrate, wherein said positive resist contains a novolak resin and a diazo ketone sensitizer and has been post-baked at a temperature of at least 150°, comprising contacting said positive resist with a stripping composition consisting of:

(a) from about 30 percent to about 70 percent by weight of 2-(2-aminoethoxy)-ethanol, 2-(2-aminoethylamino)-ethanol and mixtures thereof; and (b) from about 70 percent to about 30 percent by weight of N-methyl-2-pyrrolidinone.

* * * * *

UNITED STATES PATENT AND TRADEMARK OFFICE
CERTIFICATE OF CORRECTION

PATENT NO.  : 4,617,251
DATED       : October 14, 1986
INVENTOR(S) : Sizensky

It is certified that error appears in the above-identified patent and that said Letters Patent is hereby corrected as shown below:

In column 6, at line 12 delete "150°," and insert instead --150°C,--.

In column 7, at lines 12 and 13 delete "composiiton" and insert instead --composition--.

In column 8, at line 6 delete "cooper" and insert instead --copper--.

In column 8, at line 10 delete "150°," and insert instead --150°C,--.

Signed and Sealed this

Twenty-third Day of December, 1986

Attest:

DONALD J. QUIGG

*Attesting Officer*  *Commissioner of Patents and Trademarks*